United States Patent
Mardi et al.

(10) Patent No.: US 8,269,516 B1
(45) Date of Patent: Sep. 18, 2012

(54) HIGH-SPEED CONTACTOR INTERCONNECT WITH CIRCUITRY

(75) Inventors: Mohsen H. Mardi, Saratoga, CA (US);
David M. Mahoney, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 284 days.

(21) Appl. No.: 12/417,839

(22) Filed: Apr. 3, 2009

(51) Int. Cl.
*G01R 31/20* (2006.01)

(52) U.S. Cl. ......... 324/754.09; 324/754.08; 324/754.14; 324/754.18

(58) Field of Classification Search ............. 324/754.09, 324/754.14, 754.13
See application file for complete search history.

(56) References Cited

U.S. PATENT DOCUMENTS

| | | | | |
|---|---|---|---|---|
| 6,188,230 B1 * | 2/2001 | Birk | ......................... | 324/756.05 |
| 6,344,737 B1 * | 2/2002 | Yap et al. | ................... | 324/750.2 |
| 6,452,502 B1 * | 9/2002 | Dishongh et al. | ............. | 340/653 |
| 6,559,665 B1 * | 5/2003 | Barabi | ..................... | 324/754.08 |
| 6,564,986 B1 * | 5/2003 | Hsieh | ............................ | 228/103 |
| 6,624,645 B2 * | 9/2003 | Haseyama et al. | ........ | 324/750.25 |
| 6,636,057 B1 * | 10/2003 | Uchikura | .................. | 324/756.05 |
| 6,774,649 B2 * | 8/2004 | Hartmann | ................ | 324/756.05 |
| 6,788,090 B2 * | 9/2004 | Aihara | ...................... | 324/762.02 |
| 7,088,118 B2 * | 8/2006 | Liu et al. | .................. | 324/756.03 |
| 7,109,732 B2 * | 9/2006 | Alcoe | ....................... | 324/750.25 |
| 7,196,294 B2 * | 3/2007 | Hofmeister et al. | .......... | 219/499 |
| 7,199,599 B2 | 4/2007 | Batara et al. | | |
| 7,202,679 B2 | 4/2007 | Maruyama et al. | | |
| 7,309,996 B2 * | 12/2007 | Tashiro et al. | ........... | 324/754.13 |
| 7,446,546 B2 * | 11/2008 | Yang et al. | ............... | 324/762.02 |
| 7,837,481 B1 | 11/2010 | Mahoney et al. | | |
| 7,924,036 B2 * | 4/2011 | Tan | ........................... | 324/754.07 |
| 2004/0140821 A1 * | 7/2004 | Lee | ................................ | 324/754 |
| 2009/0085593 A1 * | 4/2009 | Yoshida et al. | ............... | 324/755 |

\* cited by examiner

*Primary Examiner* — Richard Isla Rodas
(74) *Attorney, Agent, or Firm* — LeRoy D. Maunu; Thomas George

(57) ABSTRACT

Disclosed is a contactor interconnect in an integrated circuit device test fixture comprises a plurality of contactor pins enabled to provide electrical contact with the contact points of an integrated circuit device, the contactor pins being mounted in the test fixture; and an electrical circuit coupled to two or more of the contactor pins of the test fixture, wherein the electrical circuit is isolated from other contactor pins of the plurality of contactor pins and wherein the electrical circuit is coupled to the two or more contactor pins by an electronically direct pathway.

15 Claims, 6 Drawing Sheets

HIGH-SPEED CONTACTOR INTERCONNECT WITH CIRCUITRY

FIELD OF THE INVENTION

The present application relates generally to integrated circuits, and in particular, to an integrated circuit testing apparatus and methods.

BACKGROUND OF THE INVENTION

Modern integrated circuit devices continue to shrink in size as they accelerate in speed. More and more functionality is demanded of less and less device "real estate" or available circuit space, whether on the printed circuit board of an electronic appliance or on the semiconductor die in which integrated circuits are formed.

One result of the shrinking of integrated circuits is the increasing density of the arrays of contacts that connect the circuit to the outside world. Typically formed of ball grid arrays (BGAs), a device's contacts can number in the thousands and be packed into an area of a few square centimeters.

In a typical integrated circuit package, a package substrate provides connection between the BGA and a solder bump array Testing of a packaged integrated circuit is affected by this contact density. The production testing of packaged devices is done using automated handlers that load each of the devices into contactors on a test board, then sort them based on the results of testing. These contactors are designed to provide an interconnection for the path between the packaged device and the printed circuit board (PCB). The contactor path is both a mechanical and electrical element. The mechanical aspect of the contactor provides a certain amount of force to break through the oxide on the package ball as well as provides a means to form a connection given the planarity of the package balls. The electrical connection between the specific package balls or pins is designed to be extremely short and near the package pins. To make this possible, the path is isolated from the lower half of the contact element to minimize the electrical length. This improves the bandwidth and high speed performance of the signal paths, and could improve the lifetime of the contactor in production testing. There currently are no solutions that provide the mechanical travel of the contactor, with the electrical performance needed to test our increasing high speed I/Os.

SUMMARY OF THE INVENTION

Embodiments of the present invention provide a high-speed interconnect for testing integrated circuit assemblies. Disclosed embodiments enable the testing of integrated circuits in production testing using an internal path in the contactor or socket for connecting two or more package pins while maintaining the standard contact path for the rest of the device package pins. Additionally, electronic circuitry can be placed in a cavity under the interconnect to provide decoupling, or filtering, for high or low speed applications. Currently we use a socket only to provide a connection from the packaged device to the printed circuit board functioning as an interposer. By connecting a path from one package ball to another in the socket, we would shorten the electrical path and maximize the bandwidth for production testing.

Disclosed is a contactor interconnect that enables high-speed, short-path, testing of selected contact pins of an integrated circuit device. The contactor interconnect is included in a testing apparatus that includes a plurality of contactor pins that are enabled to provide electrical contact with the contact points of the integrated circuit device. The contactor pins are mounted in a test fixture with an electrical circuit coupled to two or more of the contactor pins by a pathway that is not electronically long and the electrical circuit is isolated from other contactor pins.

In one embodiment, the substrate is a packaging substrate that also enables carrying and handling the semiconductor wafer. This allows the substrate to stay attached to the mother die and results in a packaged integrated circuit assembly upon singulation.

These and other advantages of the present invention will be obvious to those of ordinary skill in the art after reading the following detailed description of the preferred embodiments, which are illustrated in the various drawing figures.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention. In the drawings.

DETAILED DESCRIPTION

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
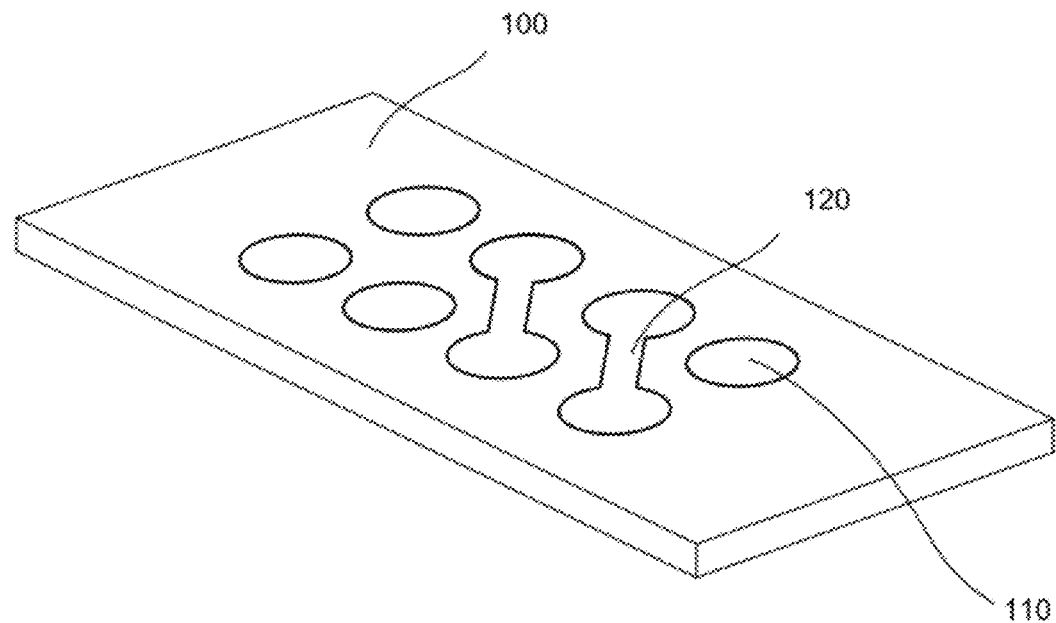
FIG. 1 illustrates a contact array in a test fixture with interconnected contact pads, in accordance with an embodiment of the present invention.

FIG. 1 illustrates a contact array in a test fixture with interconnected contact pads, in accordance with an embodiment of the present invention. In the embodiment illustrated, test fixture 100 is a plain rectangular shaped platform with a rectangular array of contact pads 110. Two pairs of contact pads 110 are interconnected 120 at the contacting surface of the test fixture.

It is noted here that the test fixture 100 is shown here as a generic rectangle with an array of plain contact points. This generic illustration comports with a mathematical model of a real-world test fixture. However, an actual test fixture is somewhat more complex. For example, turn to FIG. 2.

Figure 2:
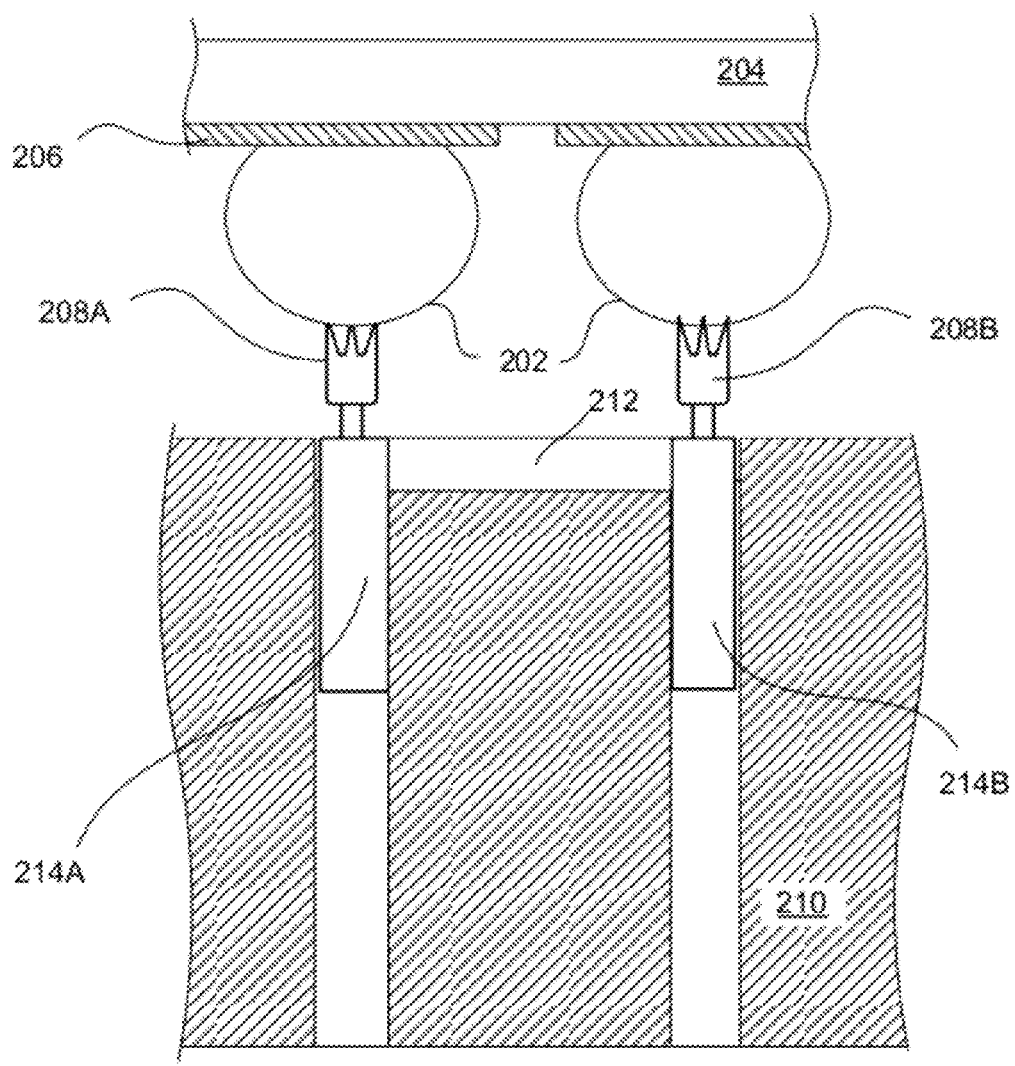
FIG. 2 illustrates the contact of interconnected contactor pins of a test fixture on solder balls of an integrated circuit device, in accordance with an embodiment of the present invention.

FIG. 2 illustrates the contact of interconnected contactor pins of a test fixture on solder balls of an integrated circuit device, in accordance with an embodiment of the present invention. In this embodiment, test fixture 210 features contact pins 214, which are enabled to make a reliable electrical contact with solder balls 202 of integrated circuit device 204. Contactor pins 214A and 214B are, in this embodiment, of a type often called "pogo pins." Pogo pins have a contact head 208A and 208B that is configured to break through any resistive oxide that forms on a solder ball and the contact head 208 is mounted on a spring in the contact pin body such that solder balls of different heights can all be made to effect electrical conductivity. While contact heads 208A and 208B are, in this illustration, configured as multi-pointed heads, other configurations are also employed. Contactor pins 214A and B also have a means 216 of connection to test circuitry associated with test fixture 210.

Solder balls 202 are illustrated here as being mounted on contact pads 206 of integrated circuit device 204. Contact pads 206 can be, in some implementations, formed on the under side of a package substrate. Another set of contact pads, formed to match the contact pads and solder bumps of the integrated circuit chip, are formed in the opposite or upper surface of the substrate and the integrated circuit chip is mounted to the substrate by means of the solder bumps. Integrated circuit device 204 can comprise an integrated circuit chip mounted to a package substrate and, in another embodiment, a stacked daughter chip mounted to the integrated circuit chip by solder bumps. The integrated circuit device assembly is typically encapsulated in a packaging material.

In the embodiment of the present invention shown in FIG. 2, contactor pin interconnect 212 is shown as a direct short between contactor pins 214A and 214B. In some test operations, a simple loop-back between I/O pins enables speedy, high frequency testing. A direct short, as shown at 212 in FIG. 2, is a very direct and expedient loop-back connection between pins 214A and 214B.

Figure 3:
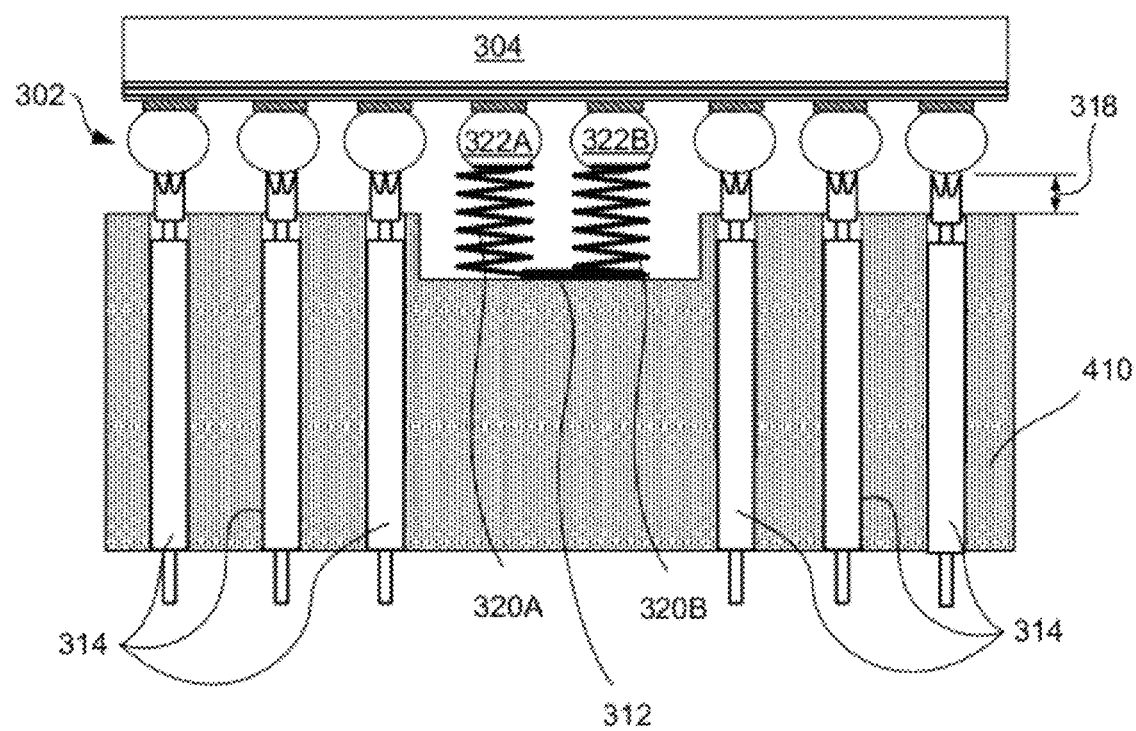
FIG. 3 illustrates an alternative interconnect between a pair of contactor pins, in accordance with an embodiment of the present invention.

In another embodiment, illustrated in FIG. 3, interconnection is established by an interconnecting wire 312 between contactor pins represented by contactor springs 320A and 320B. FIG. 3 illustrates this alternative interconnect between a pair of contactor pins, in accordance with an embodiment of the present invention. Here, test fixture 310 is shown with contactor pins 314 and contactor springs 320A and 320B. The contactor pins effect electrical contact with integrated circuit device 304 solder balls 302 and the contactor springs effect electrical contact with integrated circuit device 304 solder balls 322A and 322B. Interconnection 312 is shown connecting the back end of contactor springs 320A and 320B. In some test operations, providing a short distance in the electrical length between solder balls 322 A and 322B is beneficial in the timing characteristics of the test.

Figure 4A:
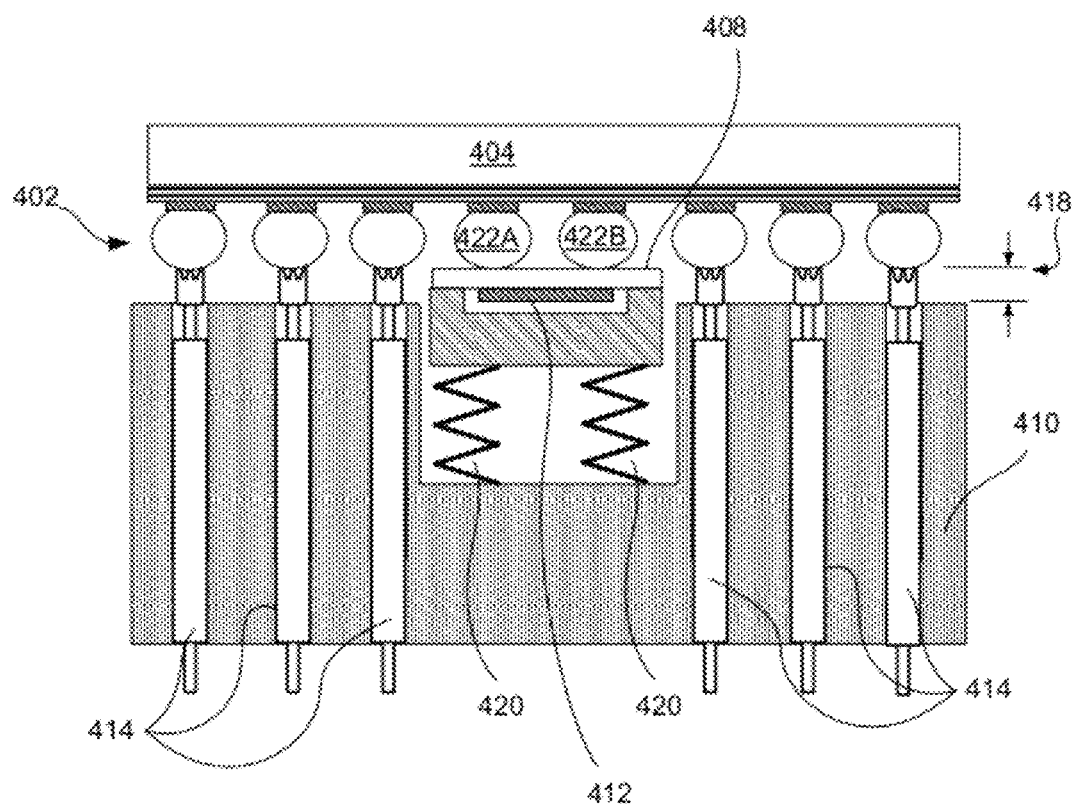
FIGS. 4A-4C illustrate a test fixture with a pair of interconnected contactor pins in a carrier, in accordance with an embodiment of the present invention.
Figure 4B:
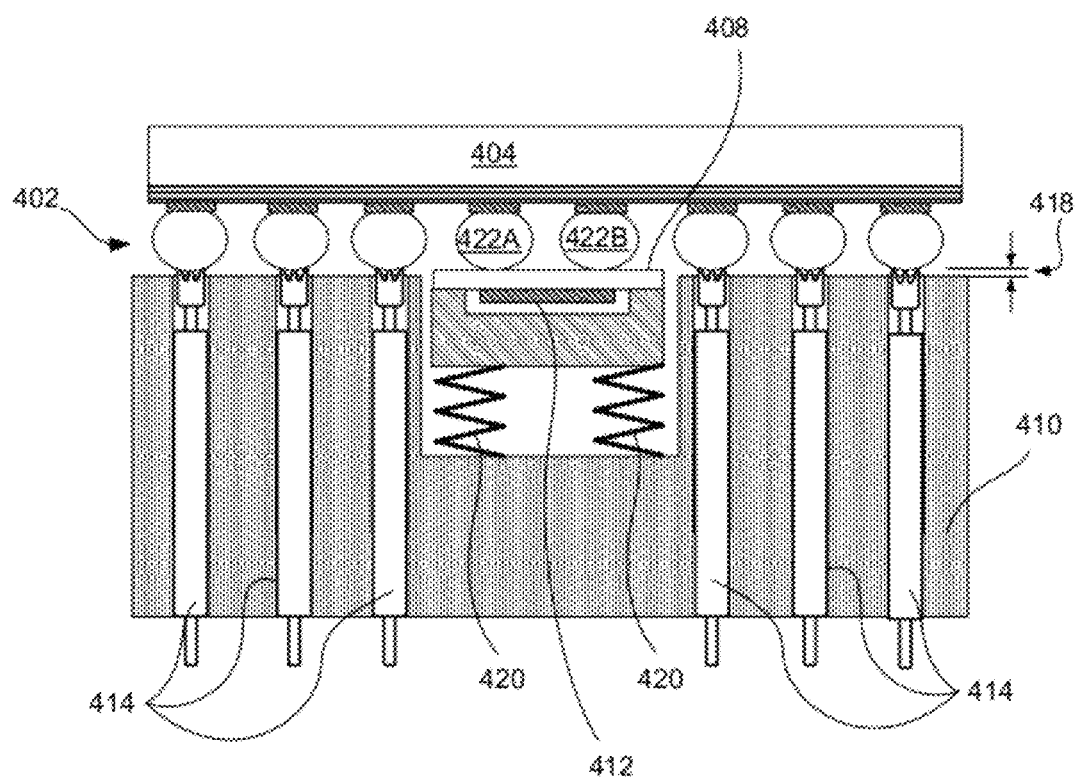
Figure 4C:
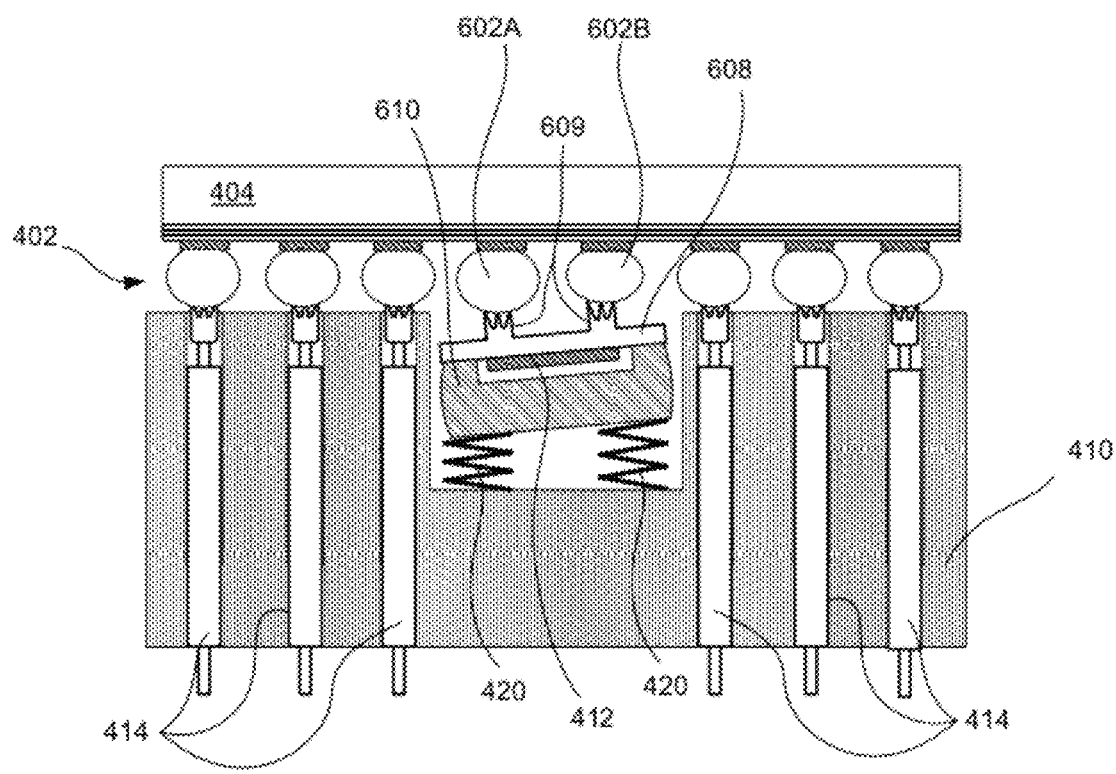

FIGS. 4A-4C illustrate a test fixture with a pair of interconnected contactor pins in a carrier, in accordance with an embodiment of the present invention. In FIG. 4A, a test fixture 410 is shown with an array of contactor pins 414 which are enabled to make electrical contact with solder balls 402 on integrated circuit device 404 by means of contact heads. Two solder balls 422A and 422B, illustrated here to represent I/O contacts intended for test, are contacted by interconnection 412 mounted on a separate carrier 408. Carrier 408 is mounted on springs 420 such that it is able to accommodate height differences in solder balls 402, much like contactor pins 414. The travel that allows this accommodation is represented in travel space 418.

FIG. 4B illustrates the closure of travel space 418. By compressing the springs 420, as well as springs in the pogo pins 414, robust electrical contact with the solder balls 402 and 422 is assured. The height of travel shown in FIG. 4B is not drawn to any scale and is exaggerated for illustrative purposes.

It is noted here that in-process and post-process oxidation of solder bumps is ever-present. The materials used in solder bumps are typically resistant to excessive oxidation, but the small size of bumps makes even a very small amount of oxide significant. Oxides are typically highly resistive if not insulating materials. For this reason, the contact point of a contactor pin is typically a hardened point or an array of points as shown at the contact points of contactor pins 414. The points are able to scratch through any oxide on the surface of solder balls 402 and assure electrical conductivity.

Another embodiment is illustrated in FIG. 4C. Here, test fixture 410 is equipped with carrier 610 which is enabled to adjust to different height solder balls 602A and 602B. Carrier 610 is mounted on springs 420 which apply pressure to contact heads 609 on interconnect 608. Also shown is test circuit 612.

Electrical conductivity with solder balls 602A and 602B is assured by contact points 609 on interconnect 608. In this embodiment, the different heights of solder balls 602A and 602B would make difficult the attainment of reliable electrical contact with interconnect 608 if the interconnect were not mounted to adaptable interconnect carrier 610. Interconnect carrier 610 is enabled to adjust to different height solder balls for this reason.

The high speed contactor interconnect illustrated in these embodiments enables the connection of specific I/O contacts or pins in an integrated circuit, essentially an internal interconnect at the integrated circuit itself. By connecting the I/O pins together, certain testing, including loop-back testing is enabled. By providing this close-in connection in a test fixture, the testing of many test articles can be accomplished relatively rapidly. The interconnect can connect a pair of package pins or a plurality, all while maintaining a standard contact path for the remaining device package pins. The provision of components adjacent to the interconnect can provide decoupling, or filtering, for various applications. By providing a shorter electrical path between package pins, the bandwidth for production testing is increased.

A high speed contactor interconnect has been disclosed herein. It will be recognized by those of ordinary skill in the art that numerous alternative embodiments and equivalents will be seen to exist which incorporate the disclosed invention. As a result, this description of the invention is not to be limited by the foregoing embodiments, but only by the following claims.

What is claimed is:

1. A test fixture, comprising:
   a base portion having opposed first and second surfaces;
   a carrier movably mounted on the base portion;
   a plurality of contactor pins enabled to provide electrical contact with contact points of an integrated circuit device, the contactor pins being mounted in the base portion and extending outwardly beyond the first surface of the base portion for contact with the contact points of the integrated circuit device;
   two or more contactor pins mounted on the carrier and arranged for electrical contact with two or more corresponding contact points of the integrated circuit device; and
   an interconnect path directly connected to and making a short-circuit between the two or more of the contactor pins on the carrier, wherein the interconnect path is isolated from the plurality of contactor pins mounted in the base portion; and
   wherein the interconnect path is disposed on a surface of the carrier that faces the contact points of the integrated circuit device.

2. The contactor interconnect of claim 1, wherein the interconnect path is enabled to provide a test function for the integrated circuit.

3. The contactor interconnect of claim 2, wherein the test function comprises a loop-back function.

4. The contactor interconnect of claim 1, wherein the carrier is movably mounted in the base portion so as to enable the two or more contactor pins to accomplish electrical conductivity with contact points of the integrated circuit of varying heights.

5. The contactor interconnect of claim 1, wherein the plurality of contactor pins comprises pogo pins.

6. A method of testing an integrated circuit device, comprising:
    providing a test fixture comprising an array of contact pins, the test fixture including a base portion having opposed first and second surfaces and a carrier movably mounted on the base portion, a plurality of the contact pins being mounted in the base portion and extending outwardly beyond a first surface of the base portion for contact with contact points of the integrated circuit device, and two or more of the contact pins mounted on the carrier and extending beyond a surface of the carrier that faces contact points of the integrated circuit;
    wherein an interconnect path disposed on the surface of the carrier short circuits the two or more of the contact pins, and is isolated from the plurality of contact pins mounted in the base portion;
    making physical contact between the contact points of the integrated circuit device under test and corresponding ones of the plurality of contact pins in the base portion and the at least two contact pins in the carrier; and
    executing one or more electrical test operations on the integrated circuit device under test, wherein a test operation of the one or more electrical test operations is accomplished by means of the interconnect path.

7. The method of claim 6 further comprising sorting each integrated circuit device of a plurality of integrated circuit devices based on the results of the test operation.

8. The method of claim 6, wherein the one or more test operations comprises a loop-back function.

9. The method of claim 6, wherein the carrier is movably mounted in the base portion so as to enable the two or more contact pins to accomplish electrical conductivity with contact points of the integrated circuit of varying heights.

10. The method of claim 6, wherein the plurality of contact pins comprises pogo pins.

11. A test fixture for testing an integrated circuit device, comprising:
    a socket for holding an integrated circuit device, the socket including a base portion having opposed first and second surfaces and a carrier that is mounted on a spring on the base portion;
    a plurality of contactor pins mounted in the base portion and extending outwardly beyond the first surface of the base portion for contact with contact points of the integrated circuit device, wherein the plurality of contactor pins is enabled to effect electrical contact with the contact points of the integrated circuit device;
    two or more contactor pins mounted on the carrier and arranged to provide electrical contact with two or more corresponding contact points on the integrated circuit device; and
    an interconnect path disposed on a surface of the carrier that faces the contact points of the integrated circuit, the interconnect path directly connected to and making a short-circuit between the two or more contactor pins.

12. The test fixture of claim 11, wherein the plurality of contactor pins comprises pogo pins.

13. The test fixture of claim 11 wherein the two or more contactor pins comprise contactor heads enabled to provide electrical conductivity through an oxide layer.

14. The text fixture of claim 11, wherein the base portion is enabled to adapt to contact points of the integrated circuit device of different heights.

15. The test fixture of claim 11, further comprising a decoupling circuit adjacent to the interconnect path.

* * * * *